(12) United States Patent
Basiri et al.

(10) Patent No.: US 12,018,974 B2
(45) Date of Patent: Jun. 25, 2024

(54) LIQUID LEVEL MEASUREMENT APPARATUS

(71) Applicant: Salar Basiri, Tehran (IR)

(72) Inventors: Salar Basiri, Tehran (IR); Aliraza Shafighi Malekshah, Tehran (IR)

(73) Assignee: Salar Basiri, Tehran (IR)

( * ) Notice: Subject to any disclaimer, the term of this patent is extended or adjusted under 35 U.S.C. 154(b) by 78 days.

(21) Appl. No.: 17/653,651

(22) Filed: Mar. 6, 2022

(65) Prior Publication Data

US 2023/0168118 A1    Jun. 1, 2023

(30) Foreign Application Priority Data

Nov. 27, 2021 (WO) .................. PCT/IB2021/061030

(51) Int. Cl.
*G01F 23/80* (2022.01)
*G01F 23/24* (2006.01)
*G01F 23/263* (2022.01)
*H05K 1/18* (2006.01)

(52) U.S. Cl.
CPC ............ *G01F 23/804* (2022.01); *G01F 23/24* (2013.01); *G01F 23/266* (2013.01); *H05K 1/189* (2013.01); *H05K 2201/10151* (2013.01)

(58) Field of Classification Search
CPC ...... G01F 23/24; G01F 23/242; G01F 23/243; G01F 23/266; G01F 23/804; G01F 23/04; G01F 23/268; G01F 23/248; G01F 23/241; G01F 23/0046; G01F 23/263; G01F 23/265; H05K 1/189; H05K 2201/10151; G06F 5/12; G06F 9/30032
See application file for complete search history.

(56) References Cited

U.S. PATENT DOCUMENTS

| | | | | | |
|---|---|---|---|---|---|
| 4,361,835 | A | * | 11/1982 | Nagy | G01F 23/72 324/207.2 |
| 4,382,382 | A | * | 5/1983 | Wang | G01F 23/243 702/53 |
| 4,765,186 | A | * | 8/1988 | Dieulesaint | G01F 23/2962 367/908 |
| 5,017,909 | A | * | 5/1991 | Goekler | G01F 23/265 73/304 C |
| 5,197,329 | A | * | 3/1993 | Grundy | G01F 23/22 338/307 |

(Continued)

FOREIGN PATENT DOCUMENTS

JP        H 11311562 A  *  11/1999

*Primary Examiner* — John Fitzgerald
*Assistant Examiner* — Truong D Phan

(57) ABSTRACT

The present disclosure generally relates to liquid level meter, and more particularly, to a flexible multi liquid level measurement apparatus and method. There is a vast need in industry and water resource management to measure level of liquid in arbitrary shaped well and in tank contained more than one liquid. Ordinary methods are not capable to determine liquid level in said cases. This disclosure proposes a liquid level meter (910) which measurement apparatus (905) is flexible. The apparatus is capable to measure liquid level in an arbitrary shape well or tank (900) where the well or tank has filled with more than one liquid (915,920,925). The measurement apparatus and method disclosed here is completely digital at inventive subject matter level and doesn't affect by environmental noises and conditions.

2 Claims, 9 Drawing Sheets

(56) References Cited

U.S. PATENT DOCUMENTS 5,257,090 A * 10/1993 Meinzer ................ G01F 23/686
356/4.09
6,529,017 B2 * 3/2003 Martin .................. G01F 23/266
73/304 C

* cited by examiner

LIQUID LEVEL MEASUREMENT APPARATUS

TECHNICAL FIELD

Present disclosure generally relates to liquid level measurement, and more particularly, to a flexible digital multi liquid level meter and a measuring system and method to determine border between various liquid.

BACKGROUND ART

Measuring liquid level in tanks and wells is very important in industry and water resource management. Measurement apparatus used for liquid level in tank and well need to be accurate and reliable. Power consumption is another key parameters of performance of any liquid level meter especially for measuring liquid level in well or tank where are located in remote areas. In some cases there are a vast need to determine different liquid level, for instance in oil industries, where different liquid in tanks and well are place on top of each other due to difference in density. Also there is a need to measure liquid level in an arbitrary shaped well.

U.S. Pat. No. 4,361,835 to Nagy Bela G has disclosed Hall-cell liquid level detector and a liquid level detector "stick" includes a column of Hall-cells adapted to be mounted vertically in a liquid's containing tank. One or more toroidal magnets are slidably fitted about the stick. A float elevates the topmost magnet to the level of liquids in the tank. If the liquids comprise two immiscible parts, a second of the magnets may be floated at the surface of the denser liquid part. A very low power electronic system continuously scans the Hall-cells and determines which particular one or ones of them are adjacent a magnet. This detector may be used in a gasoline station storage tank that may also contain water, providing accurate measure of both liquids. It is also capable of operating in a monitor mode for sounding an alarm when a change in the level of either liquid part occurs that may indicate leakage into or from the tank or an attempted theft.

U.S. Pat. No. 4,382,382 to Wang Jish M has disclosed Multilevel liquid sensing system wherein A conductive multilevel liquid sensor uses conventional integrated circuits such as inverters and voltage comparators as signal detectors, and a flat cable having corrosion-resistant probe conductors of different lengths as the sensing probe assembly. The binary encoded outputs of the signal detectors identify the sensed liquid level. A continuous level control is realized by the addition of timing logic, and sensor operation range is improved by having the voltage at one comparator input be adaptive to the change in liquid conductivity.

U.S. Pat. No. 4,765,186 to Dieulesaint Eugene has disclosed a liquid level detector by guided elastic waves. The liquid level detector using guided waves, comprises a first transducer situated out of the liquid for sending an incident elastic pulse which propagates in an elongated guide of which the lower part is immersed in the liquid, a second transducer situated out of the liquid and receiving the elastic pulse sent by the first transducer and transmitted by the guide, and electronic circuits for measuring the time elapsing between the transmission of an incident elastic pulse by the first transducer and the subsequent reception of the same elastic wave by the second transducer. The elongated guide comprises at least one smooth tube having no roughness in the longitudinal direction, the second transducer is situated in a fixed position close to the first transducer so as to receive the elastic pulse delivered by the first transducer after reflection thereof on the surface of the liquid in which is immersed the lower part of the guide, and the first transducer is arranged in such a manner with respect to the guide that periodical radial deformations of the tube are antisymmetrically created essentially in a first axial plane of the guide whereas the radial deformations created in a second axial plane of the guide perpendicular to the first axial plane are substantially equal to zero.

U.S. Pat. No. 5,017,909 to Goekler Lewis E. has disclosed a capacitive liquid level sensor. The fluid level detector include a single point capacitive sensor mounted on the outside surface of a receptacle such that capacitive principles can be utilized to sense the level of a liquid contained within the receptacle. The sensor assembly is disposed in a substantially fixed position on the exterior wall of the receptacle wherein the dielectric effect of the liquid changes the effective capacitance of the sensing capacitor as the liquid rises and falls within the receptacle. This change in effective capacitance is detected by electronic circuitry included in the detector device. In one embodiment, the fluid level detector is directly mounted to a completely non-conductive receptacle. In another embodiment, the fluid level detector is mounted to a non-conductive window which is an integral part of a receptacle fabricated out of a conductive material.

U.S. Pat. No. 5,257,090 to Meinzer Richard A. et al has disclosed a laser diode liquid-level/distance measurement. The laser diode distance measurement device includes a laser diode assembly, comprising a laser diode and photo-diode, which emits light to a lens which provides collimated light incident on a float which is covered with reflective tape on its top surface. The light is reflected from the float back to the laser diode assembly which causes the assembly to provide a signal having magnitude pulses (due to coherent interference) on a line to a liquid level measurement circuit related to the distance to the float. Use of the collimated beam and reflective tape on the float minimizes speckle while providing adequate optical intensity feedback. The laser assembly is driven by a saw tooth waveform signal that reduces electronic processing. The distance measurement circuit blanks-out the feedback signal during discontinuities of the laser diode drive signal to minimize associated noise from distorting the distance measurement. Alternatively, the float may be omitted and the tube made small enough to provide a meniscus effect curvature at a liquid surface which provides a curved reflective surface to reflect the incident light, in a consistent fashion, back to the laser assembly.

U.S. Pat. No. 5,197,329 to Grundy Andrew G. has disclosed a PTC water level sensor and control. The invention comprises a PTC resistive strip which mounted on a wall of a washer tub. Water in the tub carries away heat from the energized strip thereby reducing its resistance. The water level in the tub is measured by measuring the voltage drop across the strip. The resistance of the strip can be compared to the resistance across a variable resistance or resistor to indicate that the water has reached a desired level. A comparator output can be used to control the water level and washer motor operation via a control circuit which operates the water supply valves and motor switch. A second PTC resistive element is also provided for sensing overfill.

U.S. Pat. No. 6,529,017 to Martin, Barry E. et al has disclosed a capacitance level measurement circuit and system. The invention comprises capacitance measurement circuit and probe includes a drive circuit couplable to a constant-current source, a threshold detector, a probe capacitor, and a reference capacitor. The circuit includes a plurality of switches being actuatable to alternately couple the current source to the probe capacitor and to the reference capacitor. The drive circuit is configured to alternately generate a signal of linear ramp waveform having a slope that is proportional to the magnitude of capacitance of the probe capacitor and of the reference capacitor. The voltage differential between the probe capacitor and reference capacitor are actively nulled to nominally eliminate a parasitic capacitance there between.

Despite these and other improvement in the art, still further improvements are necessary in the field of liquid level meter and measuring device and method. Some of main issues in measuring liquid level or borders between liquid are that there is no completely digital measuring method and thus measurement are not accurate and reliable. Another problem in the field is that there is no method for measuring liquid level in complicated and hybrid vertical and horizontal arbitrary shaped well.

SUMMARY OF THE INVENTION

This summary is intended to provide an overview of the subject matter of this invention, and is not intended to identify essential elements or key elements of the subject matter, nor is intended to be used to determine the scope of the claimed implementations. The proper scope of this invention may be ascertained from the claims set forth below in view of the detailed description and the drawings.

In accordance with certain preferred embodiment of present invention, this disclosure proposes a liquid level meter and liquid border measurement apparatus and method. In a preferred aspect, the present disclosure is directed to a liquid level meter. The exemplary liquid level meter can comprise:
- at least two comparators, same inputs of the comparators (for instance all positive inputs of all comparators) are connected together and to an input terminal;
- at least two pairs of electrodes, one electrode of each pairs are connected together and to an output terminal (electrode pairs are coupled to the liquid resistively or capacitively);
- at least two diodes, anode of the diodes are connected to each comparator output and cathode of the diodes are connected to other electrode of the pairs of the electrodes (diodes cause one electrode of each pair acts as source of current not sink of current and switch between high-impedance state and source of current);
- a voltage divider, the voltage divider is connected to a predefined voltage source and connections between each two consecutive elements of the voltage divider are connected to another input of the comparators (for instance voltage divider provides the comparators negative input a step by step reference voltage);
- a variable voltage source, output of the variable voltage source is connected to the input terminal (when the variable voltage source change voltage at the input terminal, at a particular voltage the comparators which their threshold voltage are less than the variable voltage all are in one state and the comparators which their threshold voltage are more than the variable voltage all are in zero state); and
- a controller, the controller changes voltage of the variable voltage source, and determine liquid level according to voltage change at output terminal.

In one another aspect, the present disclosure is further directed to a liquid level meter for measuring level and borders between various liquid. The exemplary liquid level meter can comprise:
- at least three comparators, same inputs of the comparators are connected together and to an input terminal (for instance all positive inputs of all comparators are connected together and to input terminal);
- at least two pairs of electrodes, one electrode of each pairs are connected together and to an output terminal (electrode pairs are coupled to liquid and resistive coupling or capacitive coupling or a combination of them are possible);
- at least two two-input XOR gates, output of each two consecutive comparators are connected to one XOR gate (each two consecutive outputs of comparators are connected to one XOR gate, In fact the XOR gates trace border between zero and one outputs of comparators);
- at least two diodes, anode of the diodes are connected to output of the XOR gates and cathode of the diodes are connected to other electrode of each pairs of electrodes (diodes cause each electrode acts as source of current when the output of the XOR gates are one and as high-impedance when the output of the XOR gates are at zero state);
- a voltage divider, the voltage divider is connected to a predefined voltage source and connections between each two consecutive elements of the voltage divider are connected to another input of the comparators (the voltage divider provides each negative input of each comparator with a step by step reference voltage);
- a variable voltage source, output of the variable voltage source is connected to the input terminal (according to circuit described here change in variable voltage source can switch each comparator output between zero and one state); and
- a controller, the controller changes voltage of the variable voltage source, and determine liquid level according to voltage change in the output terminal.

In a yet another aspect, the disclosure is further directed to a liquid level meter. The exemplary liquid level meter according to the present disclosure can comprise:
- at least two comparator, same inputs of the comparators are connected together and to an input terminal;
- at least two pairs of electrodes, one electrode of each pairs are connected together and to an output terminal;
- at least two transistors, the transistors are connected to output of the comparators and switch another electrode of each pairs of electrodes (the transistors are placed instead of said diodes and have same effect on working condition of the circuit);
- a voltage divider, the voltage divider is connected to a predefined voltage source and connection between each two consecutive elements of the voltage divider are connected to another input of the comparators;
- a variable voltage source, output of the variable voltage source is connected to the input terminal; and
- a controller, the controller changes voltage of the variable voltage source, and determine liquid level according to voltage change at output terminal.

In a yet another aspect, the disclosure is further directed to a liquid level meter for measuring level and borders between various liquid. The exemplary liquid level meter according to the present disclosure can comprise:
- at least three comparator, same inputs of the comparators are connected together and to an input terminal;
- at least two pairs of electrodes, one electrode of each pairs are connected together and to an output terminal;
- at least two two-input XOR gates, output of each two consecutive comparators are connected to the XOR gates;

at least two transistors, the transistors are connected to output of the XOR gates and switch another electrode of each pairs of electrodes (the transistors are placed instead of said diodes and have same effect on working condition of the circuit);

a voltage divider, the voltage divider is connected to a predefined voltage source and connection between each two consecutive elements of the voltage divider are connected to another input of the comparators;

a variable voltage source, output of the variable voltage source is connected to the input terminal; and a controller, the controller changes voltage of the variable voltage source, and determine liquid level according to voltage change in the output terminal.

BRIEF DESCRIPTION OF DRAWINGS

In the Drawings, identical reference numbers identify same elements. The size and shape and relative position of elements are not necessarily drawn to scale. Further, the shapes of the elements as drawn, are not exactly as the actual shape of particular elements and are schematic and have been selected for ease of recognition in the drawings. The drawing figures depict one or more implementations in accordance to the present disclosure, by way of example only, not by way of limitation.

DETAILED DESCRIPTION OF THE INVENTION

In the following description, certain specific details are set forth in order to provide a comprehensive understanding of various implementation of this disclosed invention. A skilled person in relevant art could realize an embodiment of this invention may be practiced with parts of these specific details, or with other methods, circuits, components, materials, etc. In other instance, well-known structures associated with electronic systems, or details of circuit design have not been shown or described in detail to avoid unnecessarily obscuring descriptions of implementation and the focus of this disclosure is on core inventive concept including novelty, inventive step and applicability of the invention.

The words "comprising" and "including" are synonym, throughout the specification and claims, unless the context requires otherwise, and is inclusive or open ended (i.e. doesn't exclude additional, unrecited elements or method acts). The phrases "in one embodiment" or "in an embodiment" throughout this specification are not necessarily all referring to the same embodiment, and means a particular feature, structure or characteristics, and may be combined in any suitable manner in one or more embodiments of the invention. In this specification and claims, the singular forms "a", "an", and "the" further include plural referents unless the context dictates otherwise. It also important to be noted that the term "or" is employed in its sense including "and/or" unless context dictates otherwise. It means the term "or" in this disclosure means logical "OR" definition which any operates equal to true then result is true.

Figure 1:
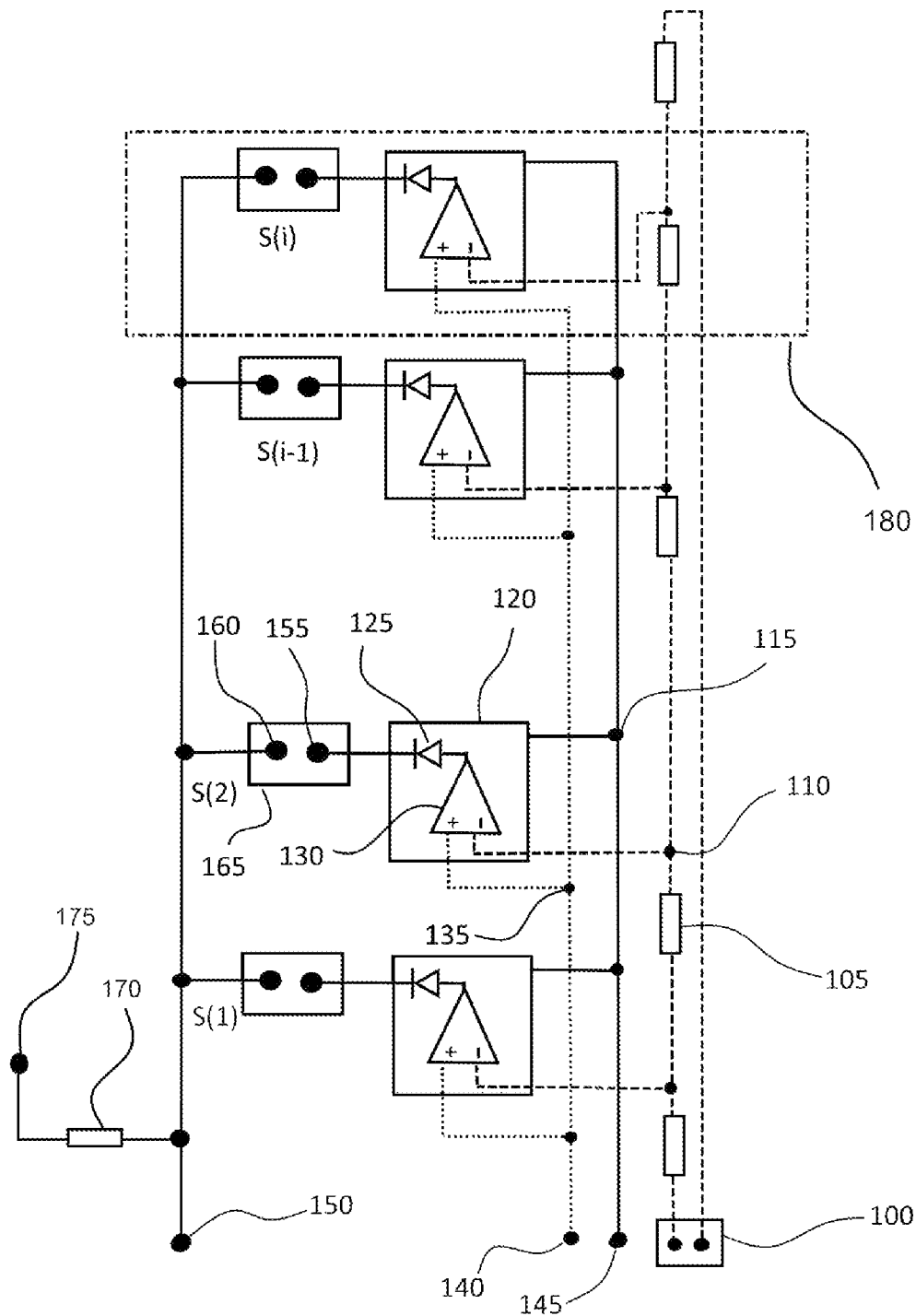
FIG. 1 shows a schematic circuit diagram of first exemplary embodiment of the invention.
Figure 3:
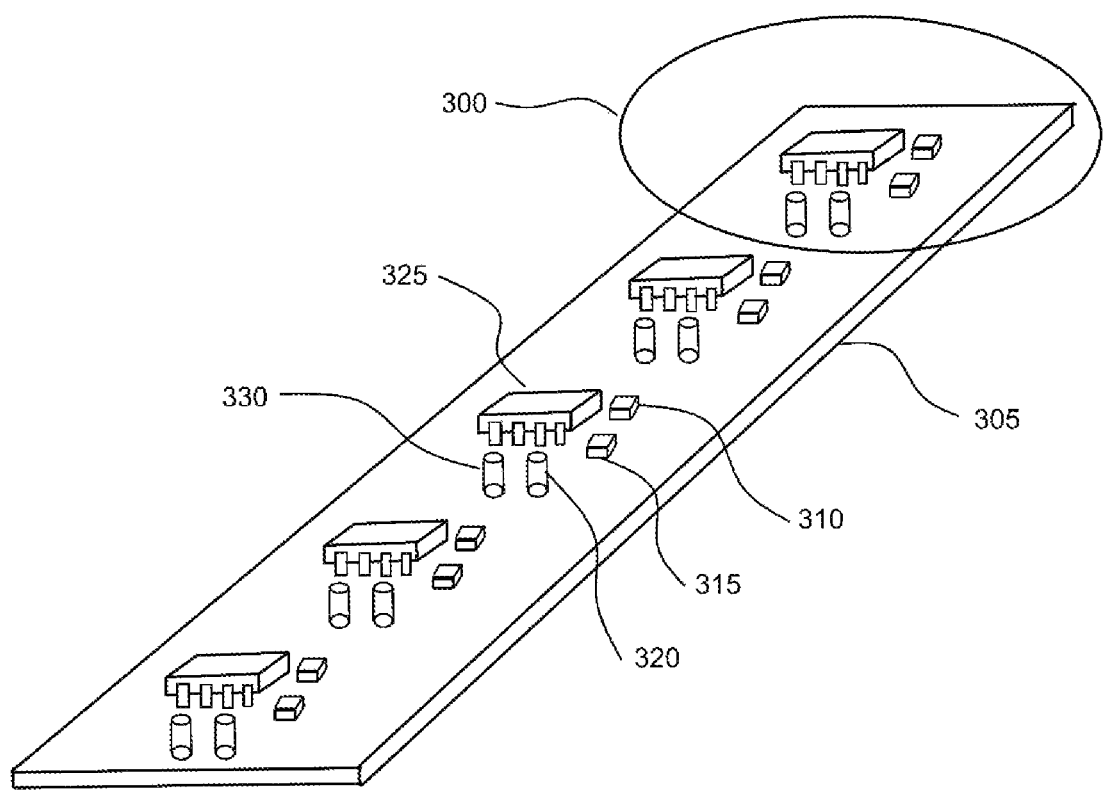
FIG. 3 shows a printed circuit board of the invention and electronic components has shown.
Figure 4:
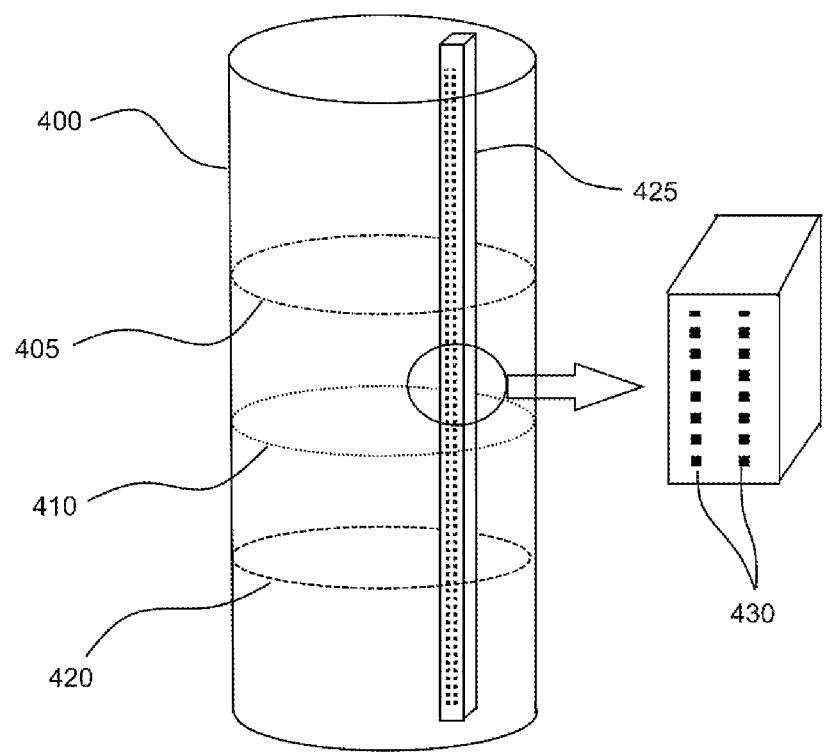
FIG. 4 shows a typical tank or well wherein filled by three kinds of different liquid and how level are measured by the invention.
Figure 5:
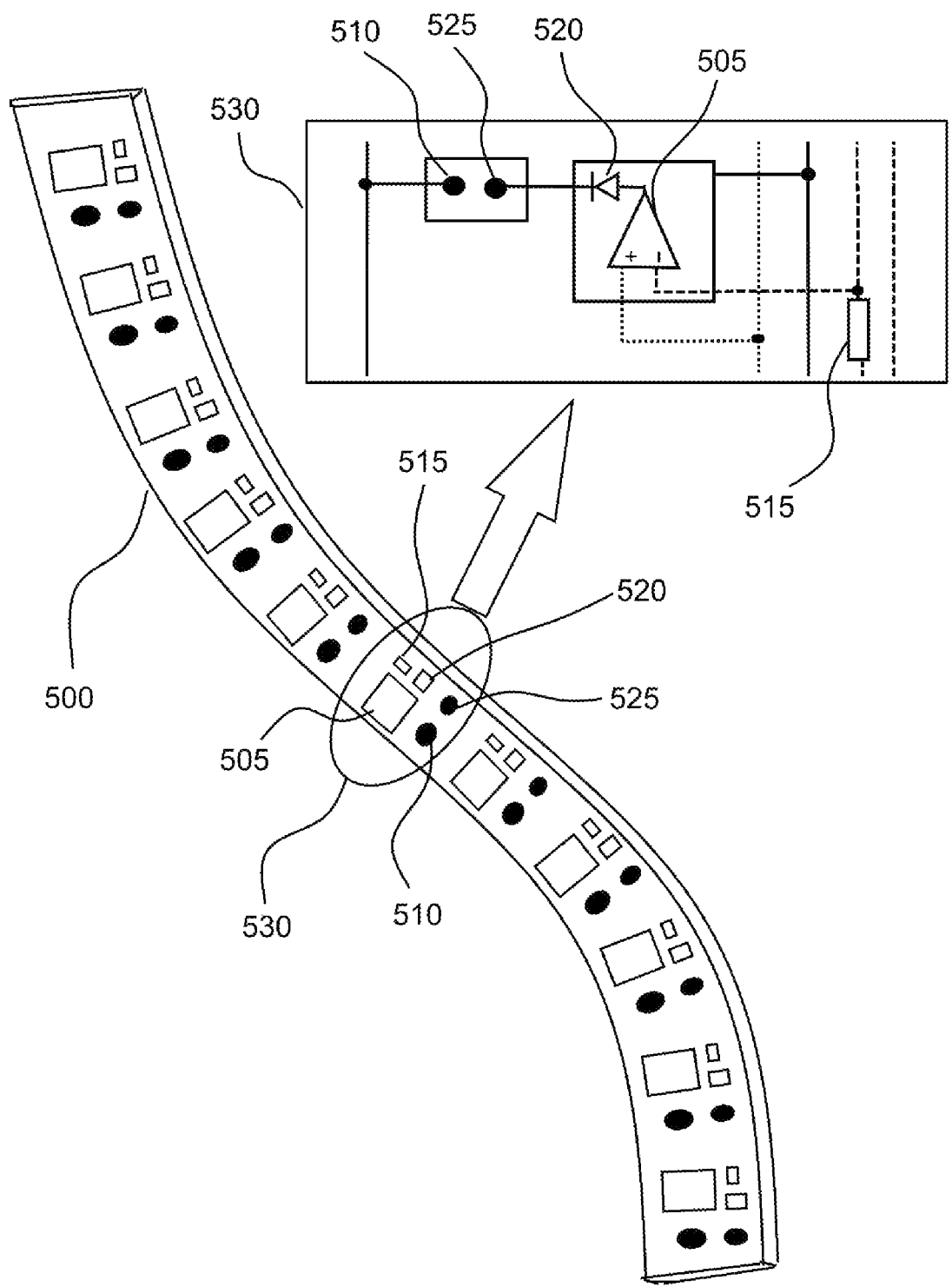
FIG. 5 shows another printed circuit board of the invention and electronic components are assembled on a flexible material.

In a part of exemplary embodiment of the invention, FIG. 1 is a schematic circuit diagram of the invention. In the embodiment, a set of voltage comparators 130 and a set of consecutive resistors 105 which form a resistive voltage divider are implemented. It's possible to implement a capacitive voltage divider, but resistive voltage divider is preferred due to ability to provide stability to inputs of comparators. A predefined reference voltage is applied to reference voltage terminal 100. The predefined reference voltage across the series resistors which form the resistive voltage divider, produces a step by step reference voltage on each two consecutive resistors connection 110 and the step by step reference voltage is connected to one input of each voltage comparator. Here the step by step reference voltage is applied to negative input of the voltage comparator, but connection to positive input of voltage comparator is also possible. Power 115 of comparators is supplied at terminal 145. Using low power comparator (e.g. TS881 or Max931) is recommended and preferred, because total power consumption of circuits, when utilizing the invention to measure very depth tank or well, will decrease. All other inputs of voltage comparators, here all positive inputs, are connected together 135 and to a variable voltage input terminal 140, then is connected to controller 600 in FIG. 6. So when voltage changes at the variable voltage input terminal 140, in the range of voltage at reference voltage terminal 100, outputs of comparators switch between zero and one consecutively. In result, when voltage in terminal 140 increase from minimum voltage to maximum voltage at the reference voltage terminal 100, outputs of comparators change from zero to one, one after another in series or each voltage comparator output is depended on a particular voltage at the variable voltage input terminal 140. Output of each voltage comparator is connected to anode of a diode 125 and cathode of the diode is connected to one electrode 155 of each pairs of sensing electrodes 165. Each comparator and related diode forms a measuring cell 120. Using transistor instead of diode is also possible. As shown in FIG. 7 base of a transistor 750 is connected to output of the comparator 735 and collector of the transistor is connected to one electrode 745, emitters of all transistor are connected together and is connected to terminal 720 and to a predefined voltage according to type of transistor (NPN or PNP). Using another kind of transistor such as FET and MOSFET is also possible and transistor type is not restricted to BJTs. In this way, it's also possible to utilize low power open collector or open drain comparator such as LM397 in an exemplary implementation of the invention. In fact transistor 750 and diode 125 act as a one way switch to allow the pairs of electrodes switch between high-impedance and source of current or between high-impedance and sink of current. Each pairs of electrodes (320 and 330) are placed with a predefined distance with another pairs on a printed circuit board (PCB) as shown in FIG. 3. Electrode pairs are coupled resistively to the liquid if they have direct contact with liquid and they coupled capacitively if the connection to the liquid is indirect and for instance where electrodes are covered by a non-conducting material. Resistive coupling is simple and straight forward for ordinary liquid. Here, in this exemplary embodiment of the invention the diode 125 is placed to cause the connected electrode 155 acts as only source of current not sink, and when the output of voltage comparator is in zero state the electrode 155 is in high-impedance state and doesn't effect on measuring procedure. All other electrodes of electrode-pairs 160 are connected together and to an output voltage terminal 150 and the output voltage terminal is connected to controller 600. A resistor 170 is connected to a predefined voltage 175 and to the output voltage terminal 150 to reduce and cancel noise on the output voltage terminal. So every pair of electrodes or electrode sensor s(1) to s(i) changes between high-impedance and current source state from start of the circuit at left side to end of circuit at right side, when input terminal 140 voltage is changed by the controller 600. To measure liquid level, controller 600 in FIG. 6, by using a digital to analog convertor 630, applies proper voltage to variable voltage terminal 140. The digital to analog convertor's voltage range varies between minimum and maximum voltage at the reference voltage terminal 100, and the reference voltage 625 is made by controller 600. Then, as voltage at terminal 140 increase, the controller by utilizing an analog to digital convertor 640 measures voltage at output voltage terminal 150. All electrodes and related comparators, resistors and diodes 180 are assembled on the printed circuit board (PCB) 305 consecutively at a predefined distance from each other. As shown in FIG. 3 voltage comparator 325, related voltage divider resistor 310, related diode 315 and related pairs of electrodes 320 and 330 are formed a measurement block 300. These measurement blocks are assembled consecutively on the PCB at predefined distance. Also, as shown in FIG. 5, it's possible to design and assemble the circuit on a flexible material and make a flexible PCB. In this method, each electronic elements such as voltage comparator 505, resistor 515, diode 520 and pairs of electrodes 510 and 525 together form the measurement block 530, and are designed and assembled in a predefined distance from each other. As a typical implementation of an exemplary embodiment of the invention it's possible to make hundreds of the measuring blocks on a flexible material according to the technology that are used to make LED strip. Using low power voltage comparator like MAX931, which consumes less than 4 uA, a circuit with 1000 units of the measurement blocks 530 consumes only 4 mA. Another alternative for comparator, for instance, is TS881. Power consumption of the TS881 low power voltage comparator, in active output state at 1.2V, is only 210 nA. So it's possible to design and make more measurement blocks on the circuit while consume less power. The PCB 500 in FIG. 5 and PCB 305 in FIG. 3 form and make body of the measurement system or a measurement apparatus 425 in FIG. 4. The measurement apparatus is sealed to prevent liquid contact with electronic components. Only pairs of electrodes 430 are in contact with the liquid (directly or indirectly) and electronic components are saved from liquid. It's possible to couple electrodes 430 indirectly in a capacitive coupling arrangement to the liquid. When the measurement apparatus 425 is placed in liquid, voltage of output terminal 150, according to difference in coupling between pairs of electrodes 165 on top of the surface of the liquid 405 and in the liquid, shows different change when consecutive switching of state of each pairs 430 from top to down, are applied by the controller 600. Because conductivity of air and liquid is very different and electrodes above the surface is coupled by air but electrodes in the liquid are coupled by the liquid. So, the controller 600, by processing output voltage 150 just after switching on each voltage comparator 130, is capable to determine liquid surface.

Figure 2:
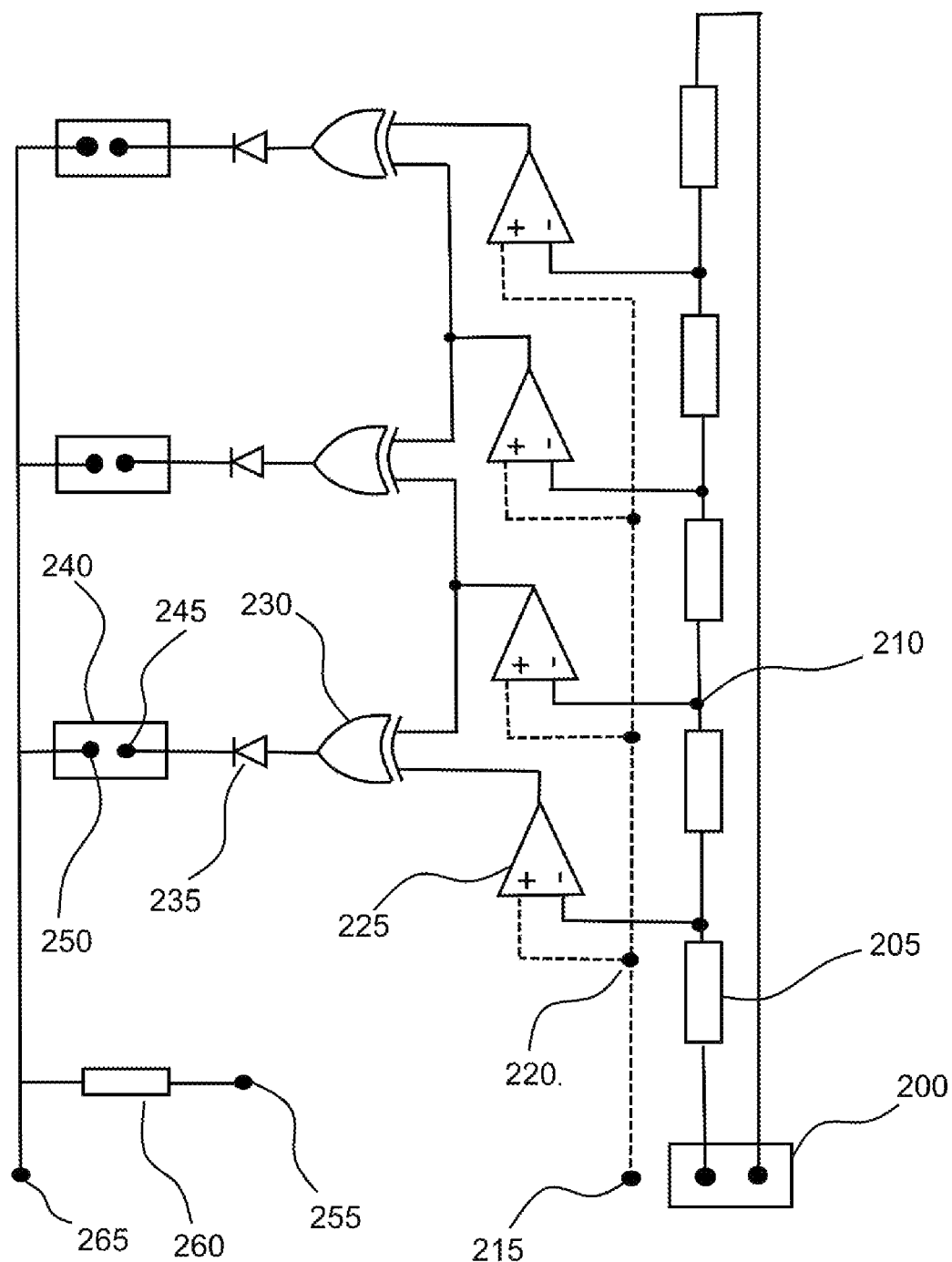
FIG. 2 shows a schematic circuit diagram of second exemplary embodiment of the invention.
Figure 8:
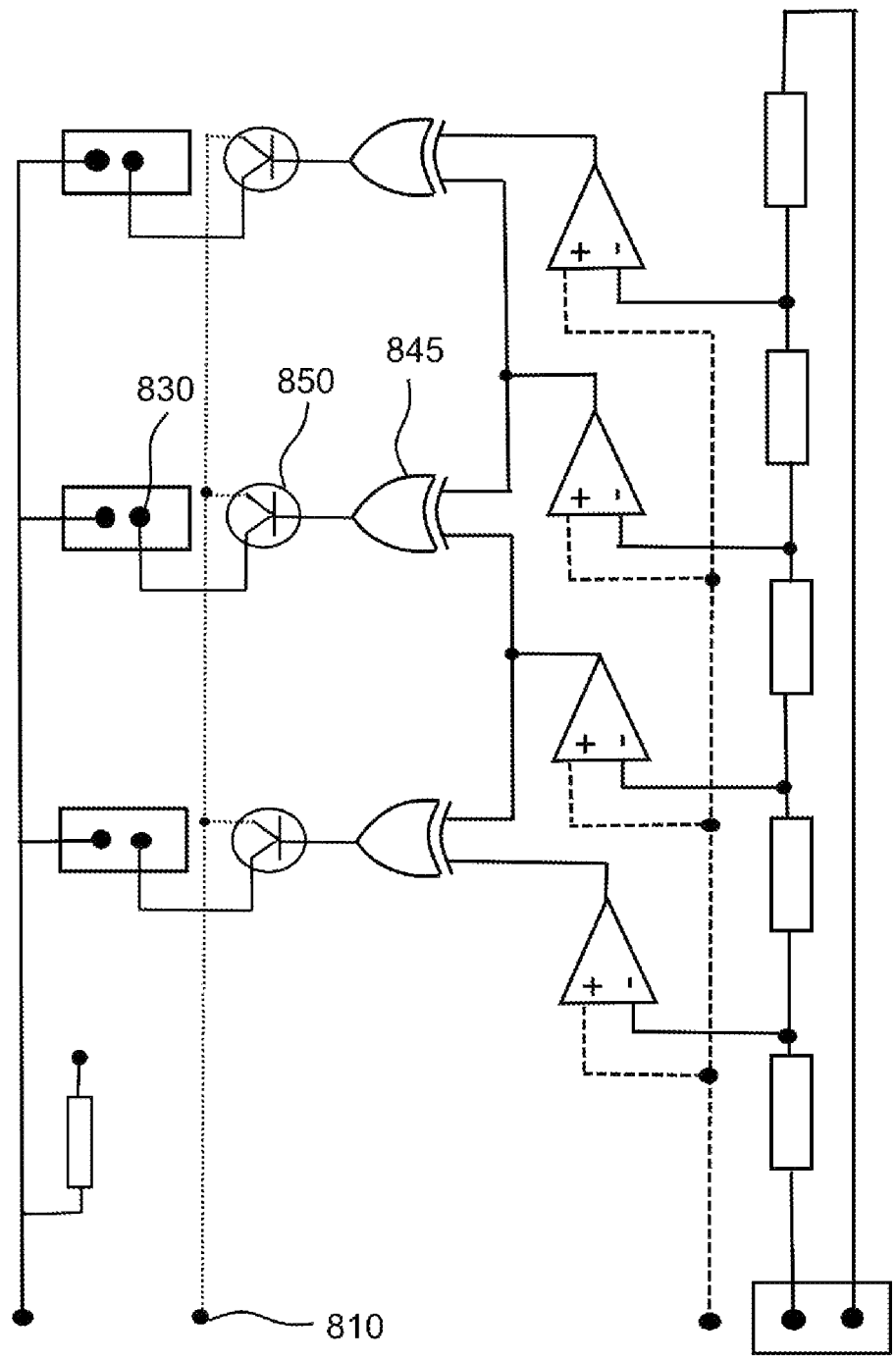
FIG. 8 shows another schematic circuit diagram of fourth exemplary embodiment of the invention.
Figure 9:
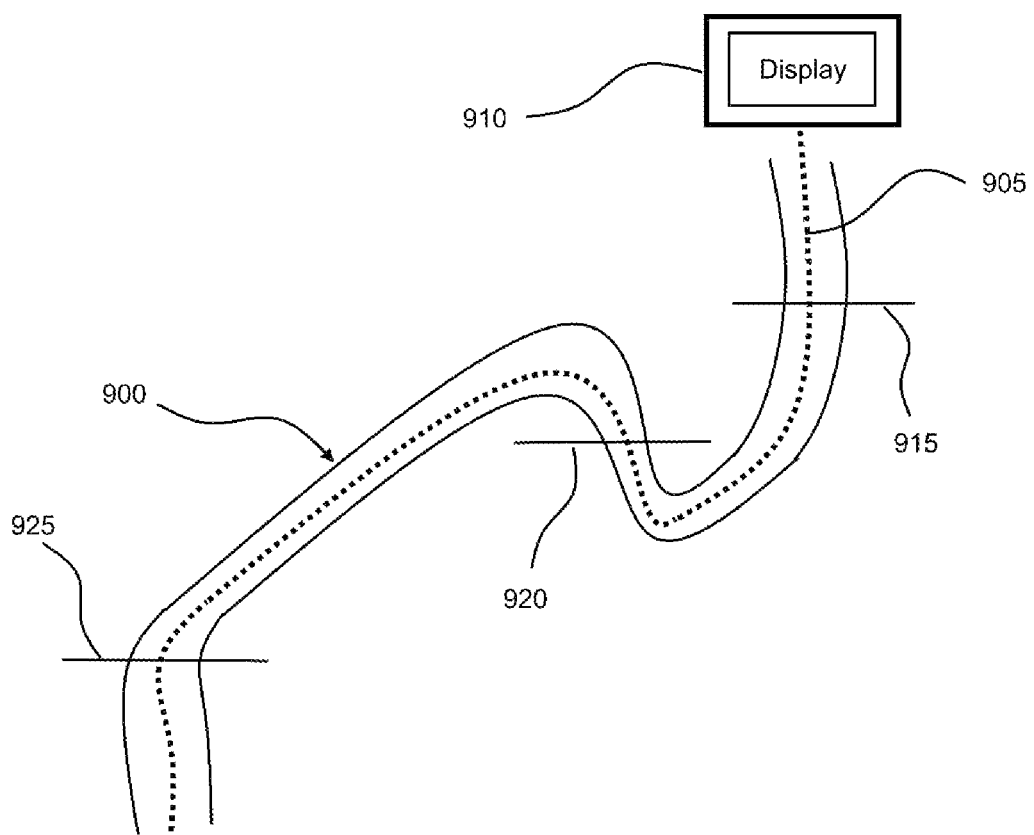
FIG. 9 shows an arbitrary shaped well, the well has filled with three different liquid and the invention is capable to measure each liquid level.

In another exemplary embodiment of disclosed Invention, FIG. 2 has shown a schematic circuit diagram of the invention. In this embodiment, in addition to the first embodiment's electronic components, a XOR gate 320 is also utilized. Series resistors 205 are connected to a reference voltage terminal 200 and step by step voltage 210 are connected to negative input of each comparators. It's possible to utilize a capacitive voltage divider, but resistive voltage divider is preferred because it can supply more stable current to comparators input. Between each two consecutive resistors, a step by step reference voltage has been produced. The step by step reference voltage is connected to negative input of voltage comparator 225. It's also possible to connect to positive input. All other inputs of voltage comparators, in this case all positive inputs 220, are connected together and to a variable voltage input terminal 215 and are accessible by the controller 600 in FIG. 6. Outputs of each two consecutive comparators are connected to inputs of a two-input XOR gate 230. The XOR gate output is in high state when output state of each two consecutive voltage comparators are different or at the border of change between zeroes to ones state of comparators. The XOR output is connected to anode of a diode 235 and cathode of the diode is connected to one electrode 245 (active electrode) of pair of electrodes 240. It's possible to utilize transistor instead of diodes. As shown in FIG. 8 base of a transistor 850 is connected to output of the XOR gate 845 and collector of the transistor is connected to one electrode 830, emitters of all transistor are connected together and to a terminal 810 and to a predefined voltage according to type of the transistor. Using other kind of transistors such as FET and MOSFET is also possible and transistor types is not restricted to BJTs. In fact transistor 850 and diode 235 act as a one way switch to allow the pairs of electrodes switch between high-impedance state and source of current state or between high-impedance state and sink of current state. All second electrode of pairs of electrodes are connected together and to output terminal 265 and are accessible by the controller 600. A resistor 260 is connected the between output terminal 265 and a predefined voltage 255, the resistor prevent the output terminal from environmental noises and so output terminal state changes according to coupling between electrodes and liquid not arbitrary signals. Main difference of second embodiment and first embodiment is using XOR gate, and due to using the XOR gate only one pair of electrodes are active (source or sink of current) at a particular time, and here, sources current to liquid and all other pairs of electrodes are in high-impedance state. The second embodiment is capable to determine level of two or more liquid with different density because of difference in electrical properties of liquid such as conductivity (FIG. 4 and FIG. 9). The pairs of electrodes are assembled in a predefined distance from each other on a printed circuit board (PCB) 305 in FIG. 3 and on a flexible PCB 500 in FIG. 5. The PCB forms the measurement apparatus 425 in FIG. 4 and is placed in the liquid 405, 410 and 420. The PCB is sealed and only electrodes 430 are coupled with the liquid directly in resistive coupling or indirectly in capacitive coupling. The controller 600, like first embodiment, applies a variable voltage to the variable voltage terminal 215 by a digital to analog convertor 630. The range of the variable voltage is between minimum and maximum voltage at the reference voltage terminal 200 that is connected to reference voltage 625 in the controller 600. In each step of increasing the variable voltage, the controller samples the terminal 265 by an analog to digital convertor 640 to process data and determine impedance between each pairs of electrodes resulted according to coupling between electrodes and the liquid. According to the properties of various liquid and air and resistive or capacitive coupling between electrodes and liquid or a combination of them, response of electrodes 250, when different pairs of electrodes change their state from high-impedance to source of current 245, is different and controller can determine level of each liquid according to the changes in response. In this embodiment at a given time only one pair of electrodes are in active state and it's possible to determine response of various liquid according to direct contact of pairs of electrodes to liquid or resistive coupling and indirect contact or capacitive coupling by controller. So as shown in FIG. 4 and FIG. 9, the controller is capable to determine level of various liquid 405,410 and 420 according to change in state of the output terminal 265 caused by difference in electrical properties of liquid and change in impedance seen between each two consecutive pairs of electrodes 430 and then determines borders between various liquid and air.

FIG. 3 and FIG. 5 show printed circuit board (PCB) of first and second embodiments of the invention. Distance between each pair of electrodes is constant, for instance 1 cm. Using SMD components can reduce the size and footprint of each measurement block (180,300 and 530). Using technique similar to LED strip manufacturing technology and sealing circuit allow making this invention in a reliable way. Each measurement block comprises a voltage comparator (325 and 505) a resistor (310 and 515) and a diode (315 and 520) or transistor 750 described for first embodiment of the invention and two voltage comparators, two resistors, one XOR gate and one diode or transistor described for second embodiment. So building components of each measurement block is relatively very low in count and profile. As shown in FIG. 5 the PCB can be designed and assembled on a flexible material, so the measurement apparatus is completely flexible and can utilize in positions where tank or well is not vertical or even the well or container consist of two or more parts (FIG. 5) and in special form an arbitrary shape (FIG. 9).

FIG. 4 shows a container filled with three different liquid. Second embodiment of the invention is capable to measure borders between liquid and determine level of each liquid, because electrical characteristics of liquid are different and response at the output terminal 150 and 165 change when controller applies variable voltage across input terminal 140 and 215 respectively. In another word, pairs of electrodes 430 which are on the measurement apparatus 425 surface in the tank 400 detect different response at the borders of liquid 410 and 420 and borders of liquid and air or gas above them 405.

Figure 6:
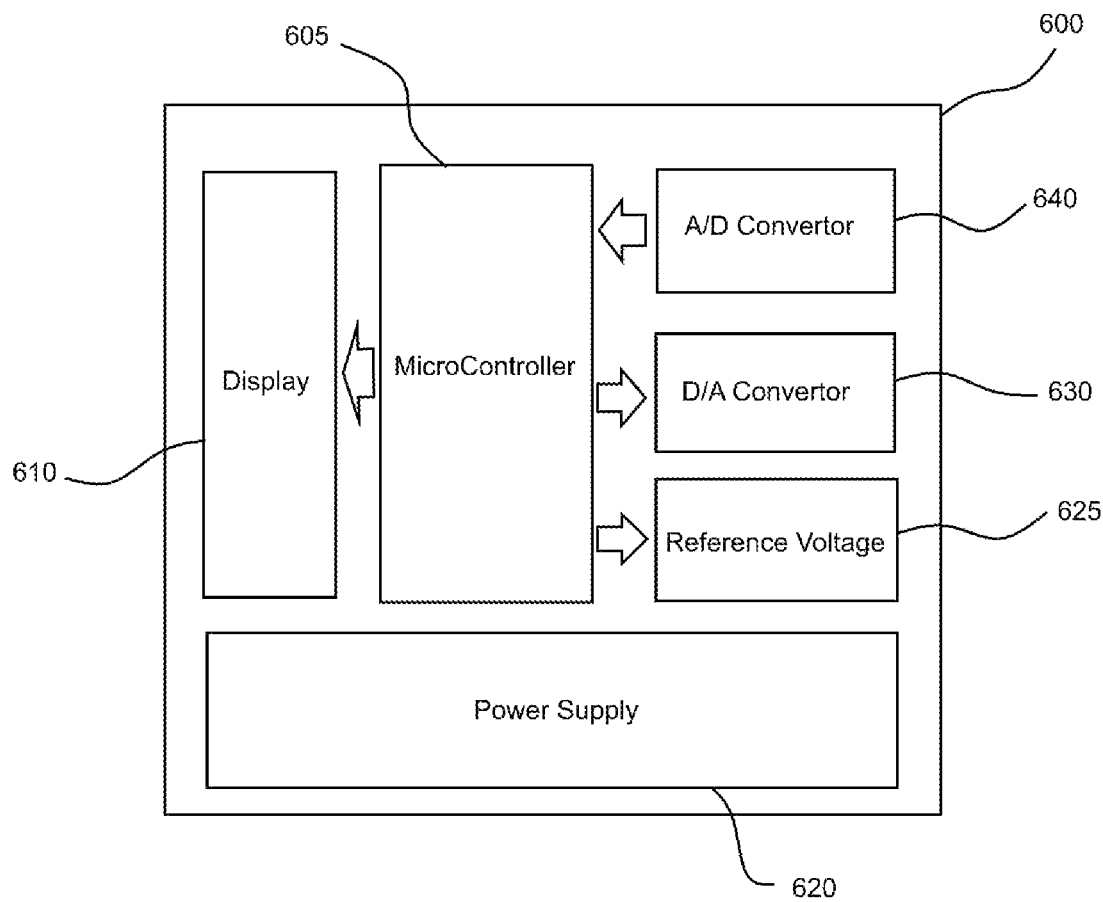
FIG. 6 shows a typical schematic block diagram of a typical controller of the invention wherein main building blocks have shown.
Figure 7:
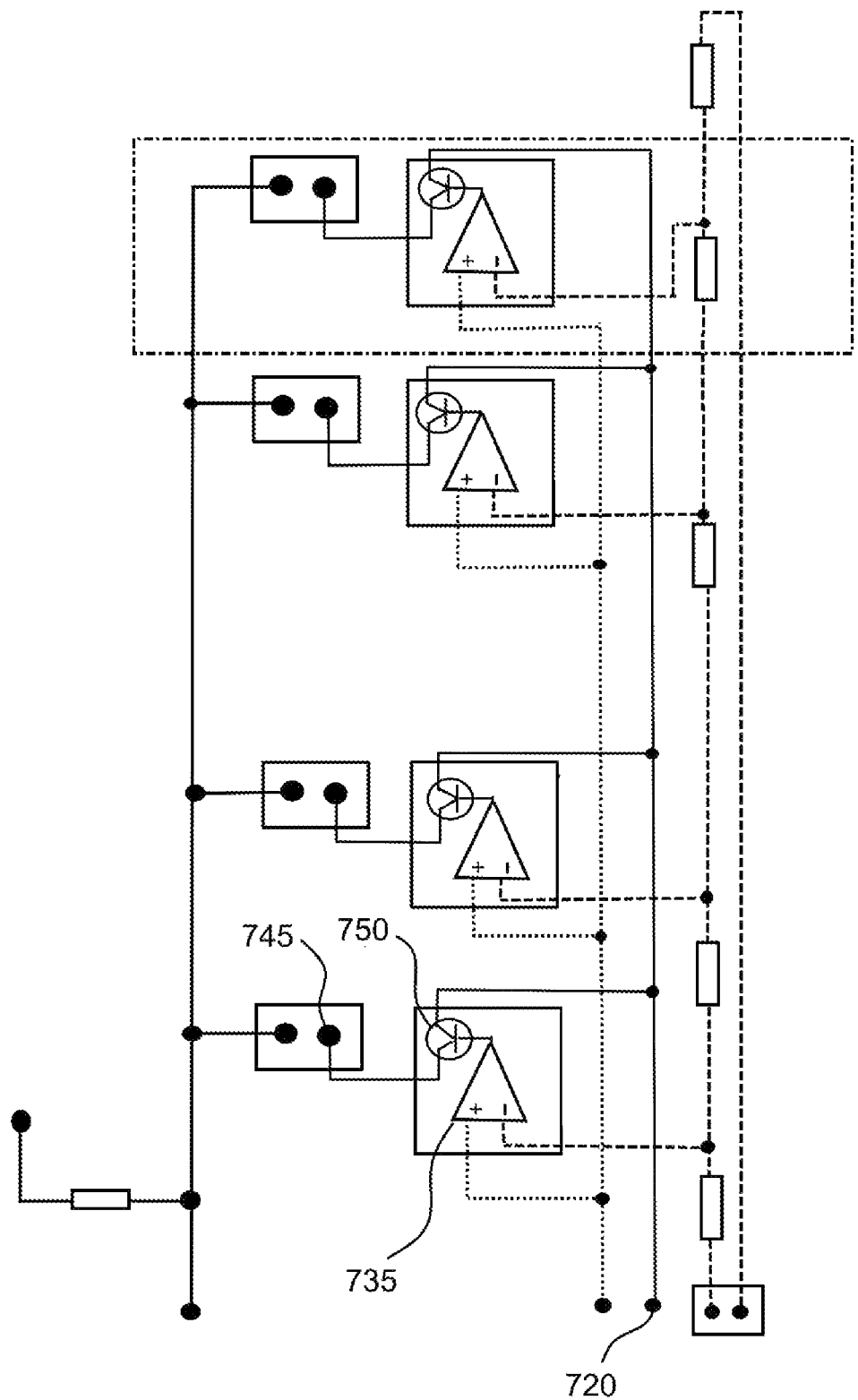
FIG. 7 shows another schematic circuit diagram of third exemplary embodiment of the invention.

Block diagram of a typical controller 600 has shown in FIG. 6. The microcontroller 605 utilizes a digital to analog convertor 630 to produce variable voltage across variable voltage terminal 140 and 215. It's possible to utilize an RC charge circuit and an analog to digital convertor connected to output of the RC circuit to monitor exact voltage of the RC charge circuit. In this way using small and low profile microcontroller in low cost or resource limited implementation of the invention is also possible. Reference voltage at terminal 100 and 200 is prepared by reference voltage circuit 625. Output voltage terminal 150 and 265 is connected to an analog to digital convertor 640 and is sampled by the microcontroller 605. Also it's possible to connect output voltage terminal 150 and 265 directly to digital input of the microcontroller according to characteristics of liquid and selection of resistor 175 and 260. But using the analog to digital convertor is preferred because rather than type of coupling and characteristics of the liquid, sampling from output terminal signal is possible and controller can determine level of liquid precisely and independent of the liquid and coupling types. The controller 600 according to change in resistance on resistive coupling situation or change in capacitance on capacitive coupling situation or both of them, and change in total impedance between pairs of electrodes 165 and 240 and liquid, determines level of various liquid and border between them and air or gas above them and shows results on display 610 or send to other controllers or network. Power of the controller is supplied by a power supply 620.

An arbitrary shaped well is shown in FIG. 9. The well shaft shape and section 900 are completely arbitrary and three different liquid with different density have filled the well. The heaviest liquid level 925, second liquid level 920 and the lightest liquid level 915 are shown in FIG. 9. Measurement apparatus 905 is placed in the well. The second embodiment of the invention is capable to measure distance between levels and then user can use data from the measurement apparatus 905 and shape of the well 900 to calculate level of each liquid.

The detailed description has set forth various implementations of the method and apparatus by means of block diagram, schematic, and example. One skilled in the art understand that each operation and function proposed in block diagrams, schematics, and examples can be implemented individually, collectively, by wide range of hardware, software, firmware, components or virtually any combination thereof. Designing the circuitry and writing the code for software and firmware would be well done within the skill of one ordinary skilled in the art and by means of details of this disclosure. Many of methods and components described herein may implement additional acts, may omit some acts, and may execute acts in a different order than specified, and this is simply recognizable by an ordinary skilled person in the art. For instance, the invention may not impalement a microcontroller and may be hardwired to provide some or all of the functionality disclosed herein.

Exemplary embodiments that are disclosed herein, are for clarity of understanding not limitation of the subject matter of this invention, and by way of example, a variety of adaptation, modification and changes are obvious to an ordinary skilled person in the art. Hence, the scope of the invention is limited solely by the appended claims.

The invention claimed is:

1. A liquid level meter, comprising:
   at least three comparators, the same input of the comparators are connected together and to an input terminal;
   at least three pairs of electrodes, the pairs of electrodes are placed at a predefined distance and the pairs of electrodes are coupled to the liquid and one electrode of each pair of electrodes all are connected together and to an output terminal;
   at least three diodes, anode of each diode is connected to each comparator output and cathode of the diode is connected to other electrode of the pair of electrodes;
   a voltage divider, the voltage divider has at least three elements and is connected to a predefined voltage and connections between each two consecutive elements are connected to another input of the comparators;

a variable voltage source, output of the variable voltage source is connected to the input terminal; and a controller, the controller changes voltage of the variable voltage source, and determine liquid level according to voltage change at the output terminal.

2. A liquid level meter, comprising:

at least three comparators, the same input of the comparators are connected together and to an input terminal;

at least three pairs of electrodes, the pairs of electrodes are placed at a predefined distance and the pairs of electrodes are coupled to the liquid and one electrode of each pair of electrodes all are connected together and to an output terminal;

at least three transistors, the transistors are connected to output of the comparators and switch another electrode of the pairs of electrodes;

a voltage divider, the voltage divider has at least three elements and is connected to a predefined voltage and connections between each two consecutive elements are connected to another input of the comparators;

a variable voltage source, output of the variable voltage source is connected to the input terminal; and a controller, the controller changes voltage of the variable voltage source, and determine liquid level according to voltage change at the output terminal.

* * * * *